(12) United States Patent
Xu et al.

(10) Patent No.: US 12,153,077 B2
(45) Date of Patent: Nov. 26, 2024

(54) DEVICE FOR TESTING SERVICE LIFE IN SIMULATED ENVIRONMENT

(71) Applicant: SHENZHEN HONGDU TESTING EQUIPMENT CO., LTD., Guangdong (CN)

(72) Inventors: Shuiyuan Xu, Guangdong (CN); Zhisheng Zhao, Guangdong (CN); Hongxian Wang, Guangdong (CN); Xiangyou Zeng, Guangdong (CN)

(73) Assignee: SHENZHEN HONGDU TESTING EQUIPMENT CO., LTD., Shenzhen (CN)

( * ) Notice: Subject to any disclaimer, the term of this patent is extended or adjusted under 35 U.S.C. 154(b) by 234 days.

(21) Appl. No.: 17/594,253

(22) PCT Filed: Mar. 27, 2020

(86) PCT No.: PCT/CN2020/081693
§ 371 (c)(1),
(2) Date: Oct. 7, 2021

(87) PCT Pub. No.: WO2020/207271
PCT Pub. Date: Oct. 15, 2020

(65) Prior Publication Data
US 2022/0178984 A1   Jun. 9, 2022

(30) Foreign Application Priority Data

Apr. 11, 2019   (CN) .......................... 201910288589.2

(51) Int. Cl.
G01R 31/00   (2006.01)
G01N 17/00   (2006.01)
G01R 31/69   (2020.01)

(52) U.S. Cl.
CPC ......... *G01R 31/003* (2013.01); *G01N 17/002* (2013.01); *G01R 31/69* (2020.01)

(58) Field of Classification Search
CPC ...... G01N 17/00; G01N 17/002; G01R 31/00; G01R 31/69; G01R 31/003
(Continued)

(56) References Cited

FOREIGN PATENT DOCUMENTS

| CN | 101749836 A | * 6/2010 | .............. F24F 11/02 |
| CN | 102262046 A | 11/2011 | |

(Continued)

OTHER PUBLICATIONS

English translation JP 2002164140 A (Year: 2002).*
(Continued)

*Primary Examiner* — Eman A Alkafawi
*Assistant Examiner* — Courtney G McDonnough
(74) *Attorney, Agent, or Firm* — Maschoff Brennan

(57) ABSTRACT

A device for testing service life in a simulated environment is disclosed, including: a testing box body, a plug testing device, a test control system, and a temperature control assembly. The plug testing device includes an upper clamp assembly and a lower clamp assembly for clamping a to-be-tested piece. The test control system includes a control module, a data acquisition module connected with the plug testing device and the temperature control assembly to acquire data, and a display panel for inputting a control instruction and displaying data. The control module can control the plug testing device to perform a reciprocating plug action at a preset temperature according to the control instruction.

8 Claims, 4 Drawing Sheets

(58) Field of Classification Search
USPC .................................................. 324/750.05
See application file for complete search history.

(56) References Cited

FOREIGN PATENT DOCUMENTS

| CN | 102680152 | A | | 9/2012 | | |
|---|---|---|---|---|---|---|
| CN | 102980704 | A | | 3/2013 | | |
| CN | 202994351 | U | * | 6/2013 | ............... | G01L 5/00 |
| CN | 206627238 | U | * | 11/2017 | ............... | G01N 3/34 |
| CN | 207281256 | U | * | 4/2018 | ............ | G01R 31/36 |
| CN | 108710042 | A | | 10/2018 | | |
| CN | 110018374 | A | | 7/2019 | | |
| CN | 210626572 | U | | 5/2020 | | |
| JP | 2002164140 | A | * | 6/2002 | ............ | H01R 43/00 |
| WO | 2020207271 | A1 | | 10/2020 | | |

OTHER PUBLICATIONS

English translation CN 206627238 U (Year: 2017).*
English translation CN 202994351 U (Year: 2013).*
English translation CN 207281256 U (Year: 2018).*
English translation CN 101749836 A (Year: 2010).*
International Search Report and Written Opinion in PCT/CN2020/081693 mailed Jun. 18, 2020.
Li Yansheng et al., "Research on testing technology and system of mechanical properties for a concentric connector", Feb. 28, 2017, Chinese Journal of Scientific Instrument, Sections 1-4 of Text, figures 1-10, China.
First Office Action, as issued in connection with Chinese Application No. 201910288589.2 dated Nov. 22, 2023.
Chinese Search Report and Written Opinion, as issued in connection with Chinese Patent Application No. 201910288589.2, dated Nov. 21, 2023.

* cited by examiner

DEVICE FOR TESTING SERVICE LIFE IN SIMULATED ENVIRONMENT

CROSS-REFERENCE TO RELATED APPLICATIONS

This application is a national stage filing under 35 U.S.C. § 371 of international application number PCT/CN2020/081693, filed Mar. 27, 2020, which claims priority to Chinese patent application No. 201910288589.2 filed Apr. 11, 2019. The contents of these applications are incorporated herein by reference in their entirety.

TECHNICAL FIELD

The disclosure belongs to the field of automatic testing technologies, and more particularly, relates to a device for testing service life in a simulated environment.

BACKGROUND

As a basic connecting element for realizing power and signal transmission, an electrical connector is widely applied to various electromechanical devices, which requires a high reliability of performances of the electrical connector. However, current testing device for electrical connectors has a single function, which mainly carries outs performance tests of the electrical connector, such as an environmental test, a mechanical performance test and an electrical performance test, but cannot simulate testing performances of the electrical connector at different temperatures, resulting in inaccurate test results, thus affecting the reliability of the performance of the electrical connector.

SUMMARY

A technical problem to be solved by the disclosure lies in providing a device for testing service life in a simulated environment, which can test a service life of a connector in different simulated environmental conditions.

Example technical solutions adopted in the disclosure to solve the above and other technical problems are as follows.

A device for testing service life in a simulated environment includes a testing box body, where the testing box body is internally provided with a test control system, and a plug testing device and a temperature control assembly which are connected with the test control system. The testing box body includes an inner cavity for a plug test, and the plug testing device includes an upper clamp assembly and a lower clamp assembly which are configured for clamping a to-be-tested piece. The test control system includes a control module, a data acquisition module and a display panel The data acquisition module is connected with the plug testing device and the temperature control assembly to acquire data. The display panel is configured for inputting a control instruction and displaying data. The control module is capable of controlling the plug testing device to perform a reciprocating plug action at a preset temperature according to the control instruction.

In an example embodiment, the temperature control assembly includes a temperature control module, a compressor unit and one or more temperature sensors arranged in the inner cavity and connected with the temperature control module, each of the one or more temperature sensors is configured for transmitting data to the control module through the data acquisition module, and the temperature control module is configured for controlling the compressor unit to reach the preset temperature according to the control instruction of the control module.

In an example embodiment, the upper clamp assembly includes a supporting member, a first driving device, a moving shaft, a first clamp and a pressure sensor arranged between the moving shaft and the first clamp for measuring a plug force. One end of the moving shaft is connected with the first driving device through a transmission mechanism, such that rotation of the first driving device drives the moving shaft to reciprocate in a vertical direction.

In an example embodiment, the transmission mechanism includes a driving wheel fixedly connected with a power output end of the first driving device, a driven wheel and a belt connecting the driving wheel with the driven wheel. One end of the moving shaft close to the driven wheel is provided with a sleeve threadedly connected with the moving shaft, such that rotation of the first driving device drives the sleeve to rotate, thus driving the moving shaft to reciprocate up and down in the sleeve.

In an example embodiment, the supporting member includes a first top plate, a second top plate and a bottom plate fixed on a top wall of the inner cavity. The sleeve is arranged between the first top plate and the second top plate and is capable of rotating relative to the first top plate and the second top plate, A supporting rod is further arranged between the first top plate and the second top plate. One or more guide rods are fixed between the second top plate and the bottom plate. The moving shaft is connected with the guide rods through a sliding plate.

In an example embodiment, the lower clamp assembly includes a base fixed on a bottom wall of the inner cavity, a Z-axis adjusting device mounted on the base and a second clamp, The Z-axis adjusting device includes a hand wheel, an adjusting plate and an adjusting rod fixed on the base and threadedly connected with the adjusting plate. The adjusting plate is further provided with a supporting plate for fixing the second clamp, and a height of the second clamp relative to the bottom wall is adjustable by adjusting the adjustable hand wheel.

In an example embodiment, the supporting plate is further provided with an X-Y adjusting platform and a second driving device driving the X-Y adjusting platform to rotate. Guide rails and a screw rod arranged between the guide rails are fixed on the supporting plate. The X-Y adjusting platform is capable of sliding along the guide rails.

In an example embodiment, the testing box body is further provided with a box door for closing the inner cavity and a camera. The box door is provided with a transparent window, and the camera is arranged outside the transparent window through a second bracket to monitor the to-be-tested piece.

In an example embodiment, one side of the testing box body is further provided with a load device for providing a load for the to-be-tested piece. The load device includes a housing, and an editable controller, a voltmeter, a voltage regulator and a heat dissipating device which are arranged in the housing. The editable controller is configured for controlling the voltage regulator to set the load according to the control instruction of the control module.

In an example embodiment, the device for testing service life in a simulated environment further includes a humidity control module. The humidity control module includes a water tank, a humidity sensor and a humidity adjusting module connected with the control module.

The disclosure has multiple beneficial effects including providing a device for testing service life of the connector includes the temperature control assembly, and the upper clamp assembly and the lower clamp assembly for a plug test, and the testing box body is internally provided with the special inner cavity for testing, which can test and obtain plug test data of the connector at different temperatures. Further beneficial effects include providing a device for testing service life of the connector that can input the control instruction and output test data in real time through the control module, the data acquisition module and the display panel, and can process the data according to an instruction inputted by a user and output comparison data.

BRIEF DESCRIPTION OF THE DRAWINGS

The disclosure is further described hereinafter with reference to the accompanying drawings and the embodiments.

DETAILED DESCRIPTION

The concepts, specific structures and technical effects of the disclosure are clearly and completely described hereinafter in combination with the embodiments and the accompanying drawings so as to sufficiently understand the objectives, the solutions and the effects of the disclosure. It should be noted that, in case of no conflict, the embodiments in the present application and the features in the embodiments may be combined with each other. In addition, the descriptions of up, down, left and right in the disclosure are made only relative to the positional relationship among the components of the disclosure in the accompanying drawings.

A connector, such as a plug and a socket, is used for transmitting a signal between different devices, and a quality of the connector is very important for signal transmission between electronic devices. A common device for testing service life of a connector can only test a single item, which can only be for testing a number of plug times and a plug force of the connector at a room temperature, or testing the service life of the connector in an extreme environmental condition. Plug test of the connector is the most basic test for detecting quality of the connector, which is mainly to test whether the connector can work normally after plugging and unplugging for many times. The device for testing service life of a connector in an embodiment at least integrates a plug testing device and a temperature control assembly, and can test the service life of a connector in different temperature conditions.

In the embodiment, the service life of a connector refers to a number of damage times of the connector during plugging and unplugging, where damage standards include mechanical performance and conductivity. Test parameters include a number of testing times at different temperatures, a plugging time, an unplugging time and a state at a time to be tested at the end of test. Test results include a number of testing times, a testing speed and a maximum force value at current temperature and voltage.

Figure 1:
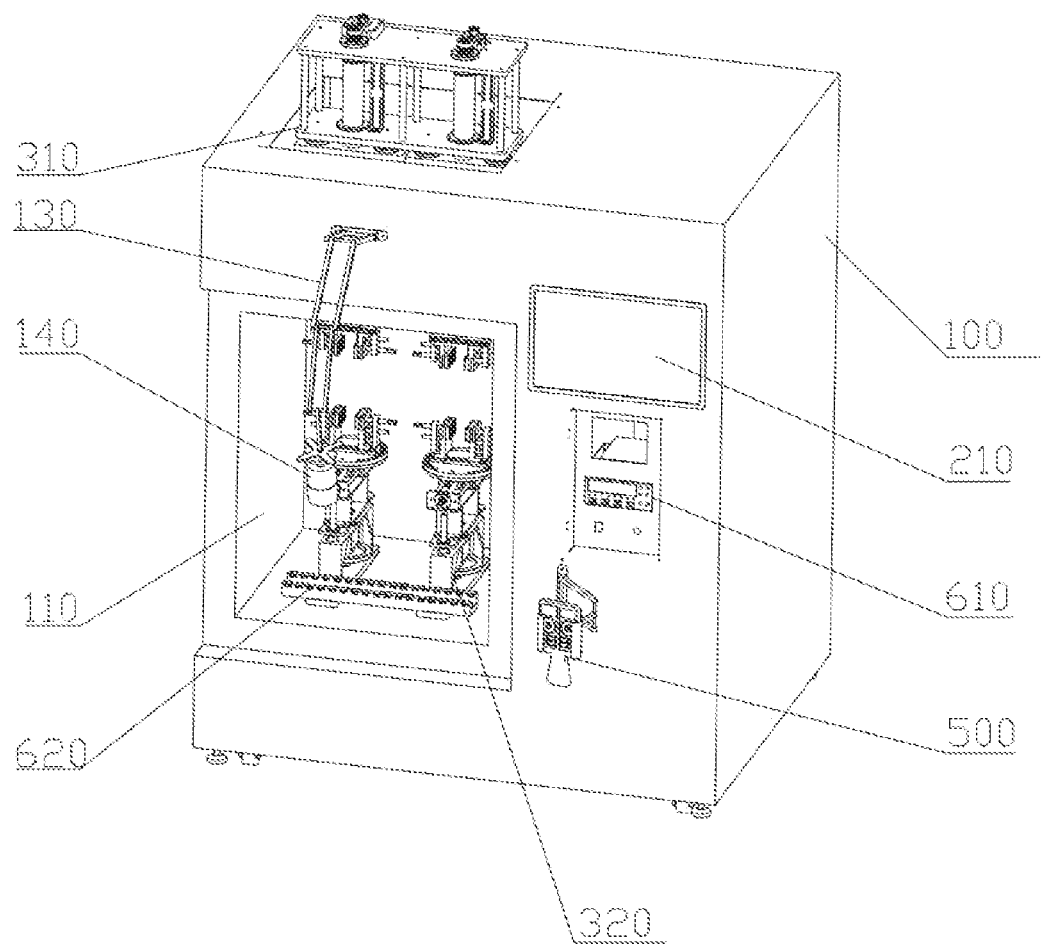
FIG. 1 is a schematic structural diagram of a device for testing service life in a simulated environment according to an embodiment of the disclosure.

With reference to FIG. 1, a device for testing service life in a simulated environment in the embodiment includes a testing box body 100, where the testing box body 100 is internally provided with a test control system, and a plug testing device and a temperature control assembly which are connected with the test control system.

The testing box body 100 is provided with an inner cavity 110 for testing, and the plug testing device includes an upper clamp assembly 310 and a lower clamp assembly 320. In the embodiment, the upper clamp assembly 310 is wholly placed in the inner cavity 110, the lower clamp assembly 320 is partially placed in the inner cavity 110, or the upper clamp assembly and the lower clamp assembly may be wholly placed in the inner cavity. The test control system includes a control module, a data acquisition module and a display panel. The control module can control the plug testing device to perform a reciprocating plug action at a preset temperature according to a control instruction, the data acquisition module is connected with the plug testing device and the temperature control assembly to acquire data, and the display panel 210 may be configured for inputting the control instruction and displaying data.

In order to better describe the relationship between various parts, a coordinate system is introduced in the embodiment. As illustrated in FIG. 1, a vertical plug movement direction of a to-be-tested piece is a Z-axis direction. Stainless steel plates are enclosed to form the inner cavity 110, and one side of the inner cavity 110 is open and closed through a box door (not illustrated in the drawings). The lower clamp assembly 320 is fixed in the inner cavity 110, and the upper clamp assembly 310 is partially placed in the inner cavity 110. In the embodiment, the testing box body 100 is internally provided with two sets of plug testing devices.

The device for testing service life in a simulated environment in the embodiment is further provided with a camera 140. Specifically, a second bracket 130 is fixed on the testing box body 100, and the camera 140 is arranged at an end of the second bracket 130. The box door is provided with a transparent window, and the camera 140 is arranged outside the transparent window through the second bracket 130 to monitor a state of the to-be-tested piece during testing.

Figure 2:
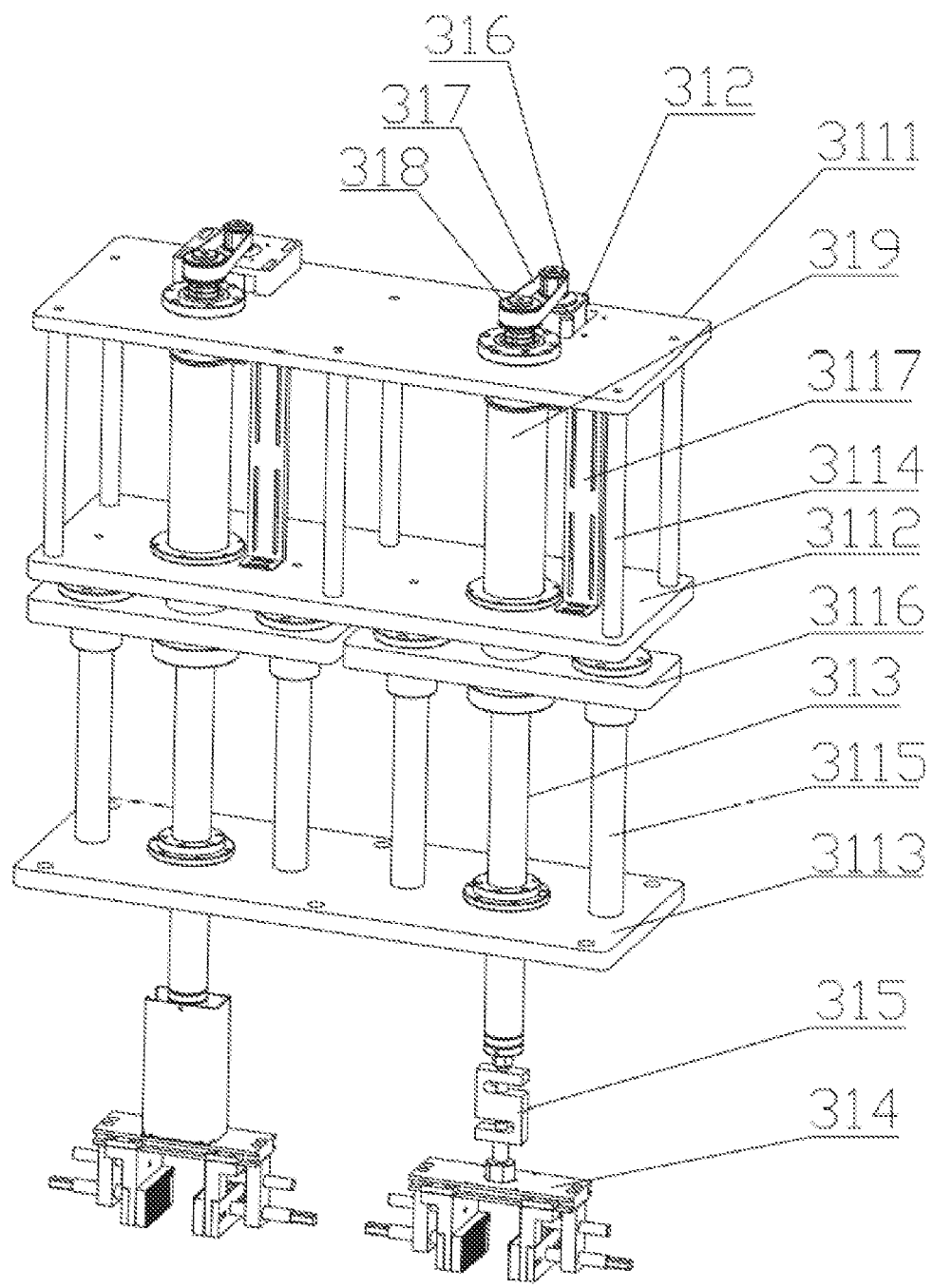
FIG. 2 is a schematic structural diagram of an upper clamp assembly according to an embodiment of the disclosure.

As illustrated in FIG. 2, the upper clamp assembly 310 includes a supporting member, a first driving device 312, a moving shaft 313, a first clamp 314 and a pressure sensor 315. One end of the moving shaft 313 is connected with the pressure sensor 315 and the first clamp 314, and the other end of the moving shaft 313 is connected with the first driving device 312 through a transmission mechanism. Specifically, the transmission mechanism includes a driving wheel 316, a belt 317 and a driven wheel 318. The driving wheel 316 is fixedly connected with a power output end of the first driving device 312, and one end of the moving shaft 313 close to the driven wheel 318 is provided with a sleeve 319 threadedly connected with the moving shaft 313.

The supporting member includes a first top plate 3111, a second top plate 3112 and a bottom plate 3113 fixed on a top wall of the inner cavity. The sleeve 319 is arranged between the first top plate 3111 and the second top plate 3112 and is capable of rotating relative to the first top plate 3111 and the second top plate 3112. A supporting rod 3114 is further arranged between the first top plate 3111 and the second top plate 3112. One or more guide rods 3115 are fixed between the second top plate 3112 and the bottom plate 3113, and the moving shaft 313 is connected with the guide rods 3115 through a sliding plate 3116. The driven wheel 318 is fixedly and integrally connected with the sleeve 319, and rotation of the first driving device 312 drives the driven wheel 318 to rotate, thus driving the sleeve 319 to rotate, so that the moving shaft 313 reciprocates in a vertical direction.

In at least some embodiments, a bracket 3117 and a limit switch arranged on the bracket 3117 are further arranged between the first top plate 3111 and the second top plate 3112.

Figure 3:
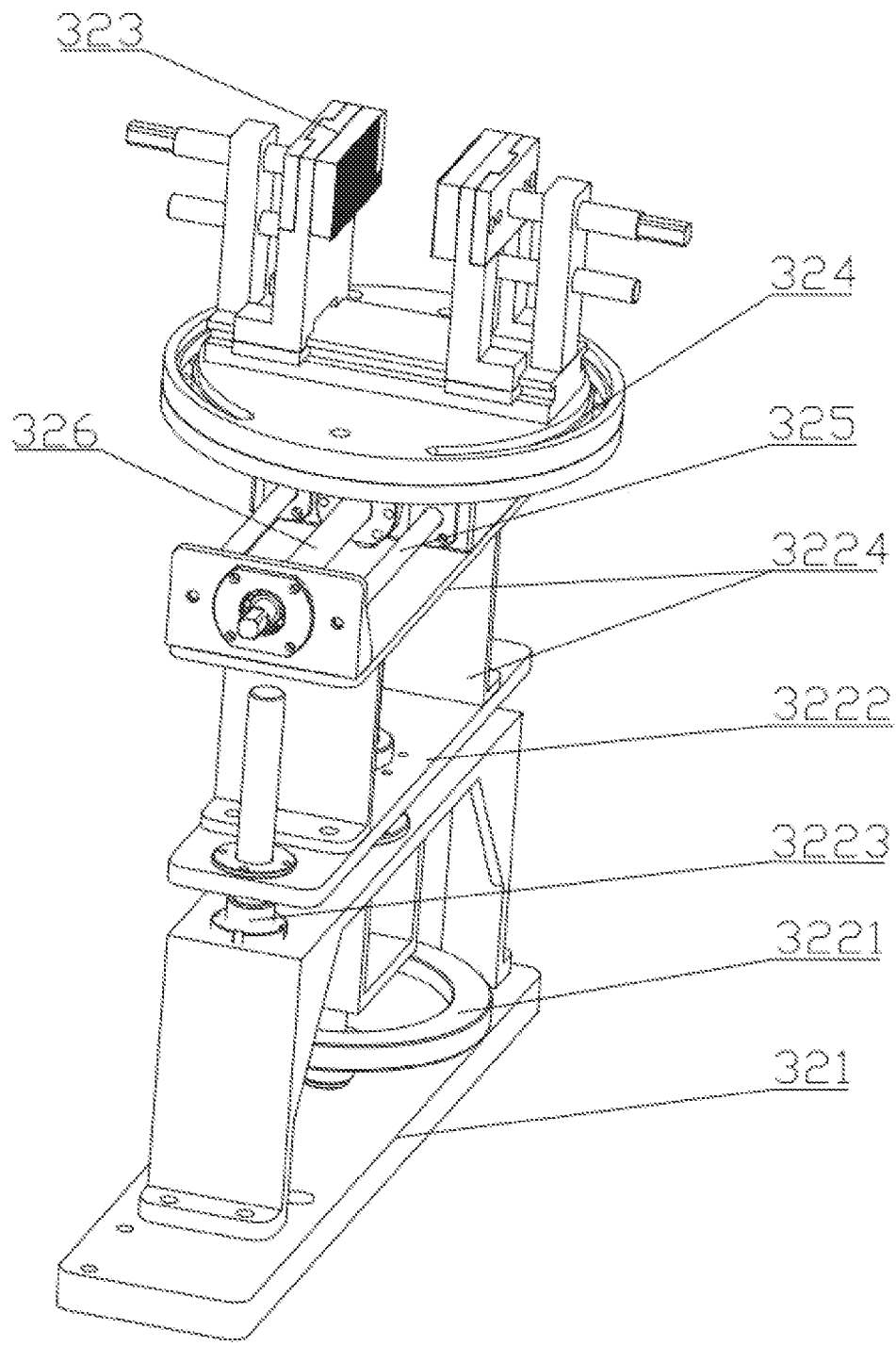
FIG. 3 is a schematic structural diagram of a lower clamp assembly according to an embodiment of the disclosure.

As illustrated in FIG. 3, the lower clamp assembly 320 includes a base 321, a Z-axis adjusting device and a second clamp 323. The Z-axis adjusting device includes a hand wheel 3221, an adjusting plate 3222 and an adjusting rod 3223 fixed on the base 321 and threadedly connected with the adjusting plate 3222. The adjusting plate 3222 is further fixedly provided with a supporting plate 3224, and the second clamp 323 may be directly arranged on the supporting plate 3224. A height of the second clamp 323 on a Z axis, which is namely in the vertical direction, may be adjusted by rotating the hand wheel 3221, and the second clamp 323 is concentrically arranged with the first clamp to ensure successful plug test.

In at least some embodiments, an X-Y adjusting platform 324 and a second driving device driving the X-Y adjusting platform to rotate are further arranged between the supporting plate 3224 and the second clamp 323. Specifically, the supporting plate 3224 is provided with guide rails 325 arranged in parallel with the adjusting plate 3222 and a screw rod 326 arranged between the guide rails. The X-Y adjusting platform may move along the guide rails under a joint action of the second driving device and the screw rod, and the X-Y adjusting platform may also drive the second clamp to rotate during testing.

Figure 4:
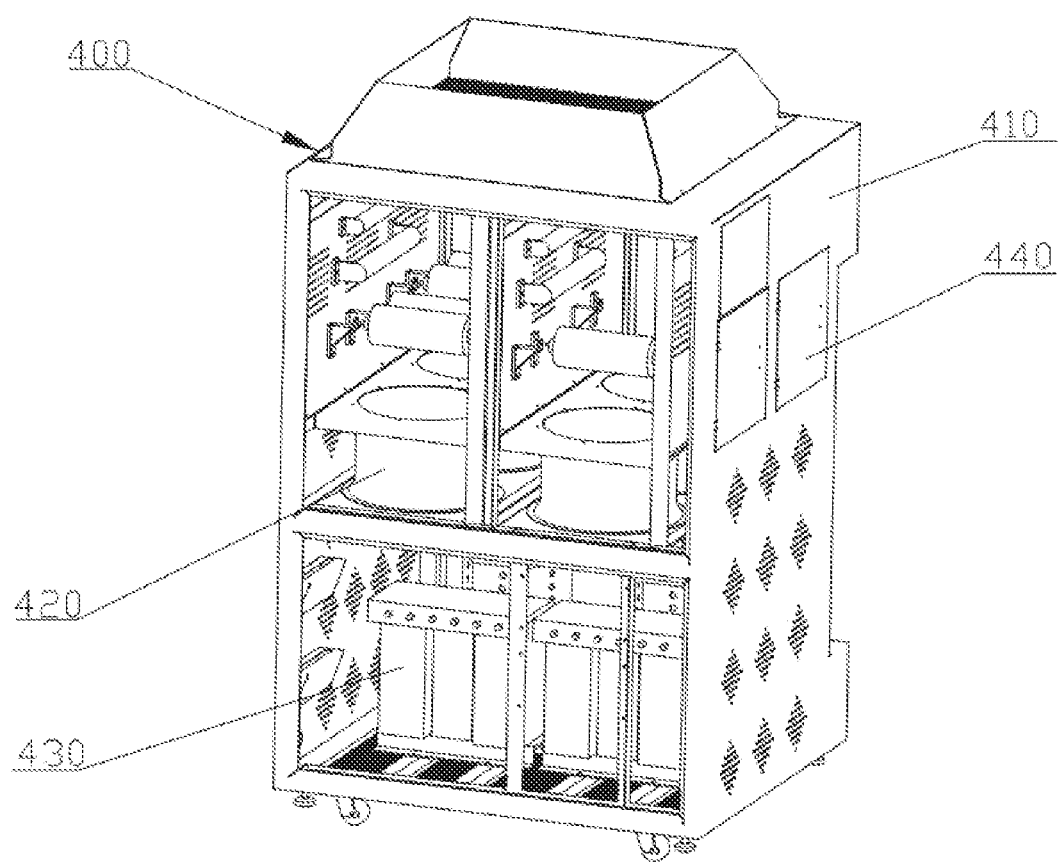
FIG. 4 is a schematic structural diagram of a load system according to an embodiment of the disclosure.

As illustrated in FIG. 4, the device for testing service life in a simulated environment in the embodiment further includes a load device 400. The load device 400 is arranged at one side of the testing box body and can provide a load for the to-be-tested piece, which means to be used for the plug test of the to-be-tested piece with the load. The load device 400 includes a housing 410, a load control panel 440 arranged on the housing 410, and an editable controller, a voltmeter, a voltage regulator 420 and a heat dissipating device 430 which are arranged in the housing 410. The editable controller controls the voltage regulator to set the load according to the control instruction of the control module.

As an example embodiment, as illustrated in FIG. 1, the device for testing service life of the connector further includes a remote-control device 500 for adjusting a movement path of the plug testing device.

The temperature control assembly includes a temperature control module 610, one or more temperature sensors 620 arranged in the inner cavity and a compressor unit (not illustrated in the drawing). A temperature in the inner cavity 110 may be set and adjusted through the temperature control module 610, which employs PID and SSR/SCR forward and reverse double-loop synchronous output.

Specifically, the data acquisition module includes a temperature acquisition module, and an Agilent data acquisition module from the United States is employed as the temperature acquisition module. The temperature sensors are connected with the temperature acquisition module, and then the temperature acquisition module collects data through the temperature sensors and feedbacks the data to the temperature control module. When the set temperature needs to be adjusted, the temperature control module transmits a signal to the compressor unit to realize a temperature change in the inner cavity.

The testing device in the embodiment may be further provided with a humidity control module. The humidity control module includes a water tank, a humidity sensor and a humidity adjusting module connected with the control module.

The control module is further connected with a normal running indicator light, an abnormal indicator light and a door opening protection switch.

The testing device includes testing steps of:
S1: checking whether or not a drainage valve of the water tank is closed, and injecting purified water into the water tank until the water is 90% full;
S2: respectively fixing two parts of the to-be-tested piece on the upper clamp assembly and the lower clamp assembly;
S3: switching on a power supply, setting a test temperature, a test humidity and test parameters according to test requirements, and running; and
S4: outputting test results.

The foregoing describes example embodiments of the disclosure in detail, but the disclosure is not limited to the embodiments. Those of ordinary skills in the art may further make various equivalent modifications or substitutions without violating the gist of the disclosure, and these equivalent modifications or substitutions are all included in the scope defined by the claims of the present application.

The invention claimed is:

1. A device for testing service life in a simulated environment, comprising a testing box body, wherein the testing box body is internally provided with a test control system, and a plug testing device and a temperature control assembly which are connected with the test control system,
wherein, the testing box body is provided an inner cavity for a plug test, and the plug testing device comprises an upper clamp assembly and a lower clamp assembly which are configured for clamping a to-be-tested piece; the test control system comprises a control module, a data acquisition module and a display panel, the data acquisition module is connected with the plug testing device and the temperature control assembly to acquire data, the display panel is configured for inputting a control instruction and displaying data, and the control module is capable of controlling the plug testing device to perform a reciprocating plug action at a preset temperature according to the control instruction,
wherein the lower clamp assembly comprises a base fixed on a bottom wall of the inner cavity, a Z-axis adjusting device mounted on the base and a second clamp; the Z-axis adjusting device comprises a hand wheel, an adjusting plate and an adjusting rod fixed on the base and threadedly connected with the adjusting plate, the adjusting plate is further provided with a supporting plate for fixing the second clamp, and a height of the second clamp relative to the bottom wall is adjustable by adjusting the hand wheel.

2. The device for testing service life in a simulated environment of claim 1, wherein the temperature control assembly comprises a temperature control module, a compressor unit and a plurality of temperature sensors arranged in the inner cavity and connected with the temperature control module, each of the temperature sensors is configured for transmitting data to the control module through the data acquisition module, and the temperature control module is configured for controlling the compressor unit to reach the preset temperature according to the control instruction of the control module.

3. The device for testing service life in a simulated environment of claim 1, wherein the upper clamp assembly comprises a supporting member, a first driving device, a moving shaft, a first clamp and a pressure sensor arranged between the moving shaft and the first clamp for measuring a plug force, one end of the moving shaft is connected with the first driving device through a transmission mechanism, such that rotation of the first driving device drives the moving shaft to reciprocate in a vertical direction.

4. The device for testing service life in a simulated environment of claim 3, wherein the transmission mechanism comprises a driving wheel fixedly connected with a power output end of the first driving device, a driven wheel and a belt connecting the driving wheel with the driven wheel, one end of the moving shaft close to the driven wheel is provided with a sleeve threadedly connected with the moving shaft, such that rotation of the first driving device drives the sleeve to rotate, thus driving the moving shaft to reciprocate up and down in the sleeve.

5. The device for testing service life in a simulated environment of claim 4, wherein the supporting member comprises a first top plate, a second top plate and a bottom plate fixed on a top wall of the inner cavity, the sleeve is arranged between the first top plate and the second top plate and is capable of rotating relative to the first top plate and the second top plate, a supporting rod is further arranged between the first top plate and the second top plate, a plurality of guide rods are fixed between the second top plate and the bottom plate, and the moving shaft is connected with the guide rods through a sliding plate.

6. The device for testing service life in a simulated environment of claim 1, wherein the supporting plate is further provided with an X-Y adjusting platform and a second driving device driving the X-Y adjusting platform to rotate, guide rails and a screw rod arranged between the guide rails are fixed on the supporting plate, and the X-Y adjusting platform is capable of sliding along the guide rails.

7. The device for testing service life in a simulated environment of claim 1, wherein the testing box body is further provided with a box door for closing the inner cavity and a camera, the box door is provided with a transparent window, and the camera is arranged outside the transparent window through a second bracket to monitor the to-be-tested piece.

8. The device for testing service life in a simulated environment of claim 1, wherein one side of the testing box body is further provided with a load device for providing a load for the to-be-tested piece, and the load device comprises a housing, and an editable controller, a voltmeter, a voltage regulator and a heat dissipating device which are arranged in the housing; and the editable controller is configured for controlling the voltage regulator to set the load according to the control instruction of the control module.

* * * * *